United States Patent [19]

Dominguez

[11] 4,116,207

[45] Sep. 26, 1978

[54] SOLAR PANEL WITH MAT BASE MEMBER

[75] Inventor: Ramon Dominguez, Rockville, Md.

[73] Assignee: Solarex Corporation, Rockville, Md.

[21] Appl. No.: 814,923

[22] Filed: Jul. 12, 1977

[51] Int. Cl.² ............................................ H01L 31/04
[52] U.S. Cl. .................................................. 136/89 H
[58] Field of Search ........................... 136/89 H, 89 P; 250/239

[56] References Cited

U.S. PATENT DOCUMENTS

| 3,957,537 | 5/1976 | Baskett et al. | 136/89 |
| 4,009,054 | 2/1977 | Gochermann et al. | 136/89 P |
| 4,056,405 | 11/1977 | Varadi | 136/89 PC |
| 4,057,439 | 11/1977 | Lindmayer | 136/89 P |

*Primary Examiner*—John H. Mack
*Assistant Examiner*—Aaron Weisstuch

[57] ABSTRACT

A solar panel including photovoltaic cells encapsulated in a silicone resin, in which the base member to which the silicone resin adheres is a glass mat polyester in laminate or molded form.

8 Claims, No Drawings

SOLAR PANEL WITH MAT BASE MEMBER

The present invention relates generally to enclosures, such as trays and frames, for holding photovoltaic cells in position so that incident light may impinge upon the surface of the cells, thereby generating electrons that can, by suitable means, be directed away from the cells and stored or utilized directly. More particularly, the present invention is directed to such a solar panel in which one or more cells are encapsulated in a substantially transparent resin so that the cells are protected from ambient conditions that would otherwise be deleterious to the function of the cells.

In making the present invention, I have been made aware of two prior applications that are presently pending before the U.S. Patent and Trademark Office. Each has been assigned to Solarex Corporation, of Rockville, MD., the assignee of the present application. On each application, Joseph Lindmayer is the named inventor. Each application relates to a solar panel in which solar cells are encapsulated in a resin, most preferably a silicone resin. When the panel is located where light will impinge on it, the solar cells that are encapsulated in the resing will be protected from hail, rain, dirt and like conditions but maintained in position so that they will generate electricity upon being subjected to radiant energy. Thus, in application Ser. No. 715,407, filed Aug. 25, 1976 and entitled, Solar Panel, now U.S. Pat. No. 4,057,439 Dr. Lindmayer disclosed a panel having solar energy cells encapsulated therein in which two different resins were utilized. As pointed out in that patent application, one problem that has been present in such solar cell panels, which are to be exposed to heat and light, is delamination from the normally flat bottom of the panel. The invention described in this patent application did assist in substantially reducing such delamination.

Still another article of manufacture in which delamination of a silicone or other resin from a base member of a solar panel has been inhibited is disclosed in U.S. application Ser. No. 806,868, filed June 15, 1977, now U.S. Pat. No. 4,093,473 and entitled, Solar Panel With UV Absorber, on which Dr. Lindmayer is also the named inventor. Based on the discovery that delamination may, at least in part, be due to the incidence of ultraviolet light on the area of surface contact of the resin and the base member of the solar panel, Dr. Lindmayer then determined that the use of a type of absorber of ultraviolet light in the silicone resin would likewise assist in mitigating this problem. Delamination, i.e., separation of the resin from the normally flat bottom or base member of the tray or other receptacle in which the resin is placed, can render a solar panel inoperative. Even if it does not render the panel inoperative, delamination can cause the panel to become unsightly and will reduce the amount of radiant energy impinging on one or more cells by varying the angle at which incident light strikes the cells.

It is, therefore, the primary object of the present invention to provide a substrate or base member for a solar panel for photovoltaic cells in which delamination of the resin from the base member is mitigated.

I have accomplished this object by utilizing a substrate alone, or as the base member for the panel, tray, or other receptacle for solar cells, a stable, insulating, glass mat polyester laminate. Such a mat is resistant to warpage at temperatures of about 150° to 200° C. and is compatible with the silicone or other resin used. Further, the glass mat has an upwardly facing surface that is in contact with the silicone resin and is formed with alternating peaks and valleys, and the peak-to-valley dimension is less than about 0.01 inch. In this manner, I find that I have achieved improved adherence of the silicone or other resin to the base member of the panel and thereby retarded delamination under adverse ambient conditions.

In more restricted embodiments of my invention, the peak-to-valley dimension is about 0.002 to 0.004 inch, most preferably 0.004 inch. Most easily, such peak-to-valley dimension can be formed by sanding the upwardly facing surface of the base member. Although it may be more expensive to provide a glass mat polyester laminate that is flame retardant, that will be an improved characteristic of the base member.

Most advantageously, the mat polyester laminate that forms the base member of a tray according to my invention, is utilized in conjunction with a solar panel having a structure as disclosed by Dr. Lindmayer in his application Ser. No. 715,407. Consequently, in such preferred embodiment, there will be a tray or other receptacle with a glass mat polyester laminate as the base member. A body of resin is composed of a layer of single-component silicone resin that will be in direct contact with the upwardly facing surface of the base member and adhered thereto, and a layer of multi-component silicone resin will overlay and be adhered to that single-component layer, the multi-component layer being thicker than the single-component layer and encapsulating photovoltaic cells there within. Indeed, it is also preferable to employ an ultraviolet light absorber, at least in the multi-component layer, all according to the two patent applications of Dr. Lindmayer referred to hereinbefore.

As has been disclosed in the prior Lindmayer applications, the conventional base member that had been used to form a solar panel is one made of epoxy fiberglass. That surface is smooth, having substantially no peaks and valleys. Such epoxy fiberglass cloths have developed several substantial difficulties in usage. Thus, at processing temperatures prior to addition of silicone resin, they tend to warp, i.e., at 150° to 200° C. temperatures there is warpage. Further, at such temperatures color changes occur, e.g., the normally white or cream colored board tends to turn brown. A polyester mat, on the other hand, has been found to have minimal deformation at 200° C. and minimal discoloration. In addition, the smooth surface of the fiberglass board is difficult to adhere any resin to; consequently, it is difficult to prime the upwardly facing surface of a fiberglass board, and delamination occurs in processing, i.e., curing of the resin, as well as in the field. Moreover, epoxy fiberglass base members have a tendency for the epoxy resin to decompose during exposure to ultraviolet light, whereby the base member develops a chalking on the outside of the fiberglass. This chalking aggravates water absorption by individual fibers of the glass substrate, which are exposed and thereafter act as wicks to carry water from external surfaces of the base member through the base member and into contact with the silicone resin conterminous therewith. Such moisture accelerates the delamination process.

In the preferred embodiment of my invention, I utilize a glass mat polyester laminate as the base member of a solar panel, which mat is sold by the Glastic Corporation of Cleveland, Ohio, under the trademark Glastic 200. The mat may have a thickness preferably between 1/16 and ⅛ inch, with 3/32 inch being preferred. More specifically, the upwardly facing surface of the mat has alternating peaks and valleys and, most preferably, the peak-to-valley dimension is 0.004 inch. Such alternating peaks and valleys are achieved by sanding the upwardly facing mat surface in such manner as will be apparent to those of skill in this art. Although more expensive, a mat polyester laminate that is flame retardant, such as Glastic 200 FR may be substituted. Also, a UV inhibitor may be incorporated in the mat.

With respect to the specific structure of a solar panel in which the base member of the present invention is utilized, reference is made to said application Ser. No. 715,407, which is incorporated herein by reference where necessary. Where it is required, said other Lindmayer application filed June 15, 1977, is also incorporated by reference.

Several other base member compositions, in addition to epoxy fiberglass, have been found to be markedly inferior to the polyester mat that has been found to be successful in resisting delamination from a silicone resin layer. Thus, resins in the form of board with paper embedded therein have not been successful. Ureaformaldehyde resins have been found decidedly inferior, as are polyvinyl chloride boards. Still further, epoxy fiberglass is not readily capable of being sanded and thereby being formed with an upwardly facing surface with alternating peaks and valleys. This is because fiberglass is an impregnated cloth, whereas the polyester mat that I have found to be far superior in terms of resistance to delamination is a mat with random fibers. A mat of random fibers is less susceptible to wicking. Therefore, delamination is not accelerated by moisture brought to the base member-resin interface which often occurs when cloth is utilized. With random fibers, any moisture that wicks into fibers at the outside of the board or mat will not be directed through the mat but, according to the arrangement of the fibers, will usually remain within the interior of the mat, and moisture will thus not be wicked into the interior of the solar panel. Further, it is not advantageous to attempt to form a surface with peaks and valleys when a cloth is utilized as a base member, since sanding will necessarily expose fibers of the cloth. Such exposure of fibers may seriously weaken the cloth and also aggravate wicking directly to the cloth-resin interface. Moreover, a glass mat polyester can either be laminated or molded, whereas epoxy fiberglass can only be obtained in sheet form.

It will be apparent to those of skill in this art that certain alterations, modifications and substitutions may be made in the preferred embodiment of the present invention disclosed herein. For example, while a mat containing a polyester laminate having relatively long chains, such as is exemplified by Glastic 200, is most preferred, laminates formed from polyester resins having shorter chains are useful, although most certainly not preferred. As to all such alterations, modifications and substitutions, it is intended that they be included within the scope of the present invention, which is to be limited only by the scope, including equivalents, of the following, appended claims.

I claim:

1. A solar panel which maintains solar energy cells in position to receive light impinging thereon, comprising a base member having an upwardly facing surface with respect to the source of light, a body of cured silicone resin adhesively adhered to said upwardly facing surface, and photovoltaic cells disposed within and encapsulated by said body of resin so that said cells are maintained by said panel in position to receive light impinging on surfaces thereof and convert such light into electrical energy while being protected from ambient conditions by said body of resin, wherein said base member is formed from an, insulating, glass mat polyester that is resistant to warpage at temperatures of about 150° to 200° C. said upwardly facing surface of said base member being formed with alternating peaks and valleys in which the peak-to-valley dimension is less than about 0.01 inch to improve adherence of said body of resin to said mat and retard delamination under adverse ambient conditions.

2. A solar panel as claimed in claim 1, in which said peak-to-valley dimension is about 0.002 to 0.004 inch.

3. A solar panel as claimed in claim 2, in which said peak-to-valley dimension is about 0.004 inch.

4. A solar panel as claimed in claim 1, in which said glass mat polyester is flame retardant.

5. A solar panel as claimed in claim 1, in which said glass mat polyester is in the form of a laminate.

6. A solar panel which maintains solar energy cells in position to receive light impinging thereon, comprising a tray within which said cells are mounted, said tray including side and end members and a base member having an upwardly facing surface within the space bounded by said tray, a layer of cured single-component silicone resin adhesively adhered to said upwardly facing surface, a layer of cured multi-component silicone resin adhered to said single-component layer, said single-component layer being thinner than said multi-component layer, and photovoltaic cells disposed within and encapsulated by said multi-component layer so that said cells are maintained by said panel in position to receive light impinging on surfaces thereof and convert such light into electrical energy while being protected from ambient conditions by said multi-component layer of resin, said base member being formed from an, insulating glass mat polyester that is resistant to warpage at temperatures of about 150° to 200° C.

7. A solar panel as claimed in claim 6, in which said upwardly facing surface of said base member is formed with alternating peaks and valleys in which the peak-to-valley dimension is less than about 0.01 inch to improve adherence of said single-component layer to said mat and retard delamination under adverse ambient conditions.

8. A solar panel as claimed in claim 6, in which said upwardly facing surface is formed by sanding and said peak-to-valley dimension is about 0.002 to 0.004 inch.

* * * * *